United States Patent
Okamoto

(10) Patent No.: US 6,878,303 B2
(45) Date of Patent: Apr. 12, 2005

(54) SUBSTRATE PROCESSING APPARATUS AND SUBSTRATE PROCESSING METHOD

(75) Inventor: Yoshio Okamoto, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 104 days.

(21) Appl. No.: 10/347,845

(22) Filed: Jan. 17, 2003

(65) Prior Publication Data

US 2003/0132193 A1 Jul. 17, 2003

(30) Foreign Application Priority Data

Jan. 17, 2002 (JP) ........................................ 2002-009131

(51) Int. Cl.[7] .......................... H01B 13/00; C23C 16/00
(52) U.S. Cl. .............................. 216/93; 216/83; 216/84; 156/345.15; 156/345.18; 156/345.24; 156/345.5; 134/10; 134/33; 134/104.2; 134/109; 134/113; 427/240; 427/421.1; 427/425; 118/52; 118/602; 118/712
(58) Field of Search ............................. 216/23, 24, 83, 216/84, 92, 93; 427/240, 421.1, 425; 134/10, 33, 104.2, 109, 113, 119; 156/345.15, 345.18, 345.24, 345.55; 118/52, 600, 602, 712

(56) References Cited

U.S. PATENT DOCUMENTS

| | | | |
|---|---|---|---|
| 6,200,414 B1 * | 3/2001 | Hwang et al. ......... | 156/345.18 |
| 6,551,422 B1 * | 4/2003 | O'Connor .................... | 148/509 |
| 6,736,926 B2 * | 5/2004 | Chopra et al. ......... | 156/345.13 |
| 2002/0036501 A1 * | 3/2002 | Astley et al. ............... | 324/318 |
| 2003/0132193 A1 * | 7/2003 | Okamoto ..................... | 216/13 |

FOREIGN PATENT DOCUMENTS

| | | | |
|---|---|---|---|
| JP | 63-137430 | * | 6/1988 |
| JP | 11-345849 | | 12/1999 |

* cited by examiner

Primary Examiner—Jeffrie R. Lund
(74) Attorney, Agent, or Firm—Ostrolenk, Faber, Gerb & Soffen, LLP

(57) ABSTRACT

A substrate processing apparatus for supplying a treatment liquid onto the surface of a substrate to treat the same. This apparatus is provided with: a spin chuck for holding and rotating a substrate; a nozzle for supplying a treatment liquid to the substrate held by the spin chuck; a circulating passage arranged such that the treatment liquid supplied to the substrate from the nozzle and used for substrate treatment is circulated to the nozzle and reutilized for substrate treatment; a metal contamination amount measuring device for measuring the metal contamination amount in the treatment liquid passing through the circulating passage; and a judgment processing unit for judging whether or not the value measured by the metal contamination amount measuring device has exceeded a predetermined set value.

20 Claims, 3 Drawing Sheets

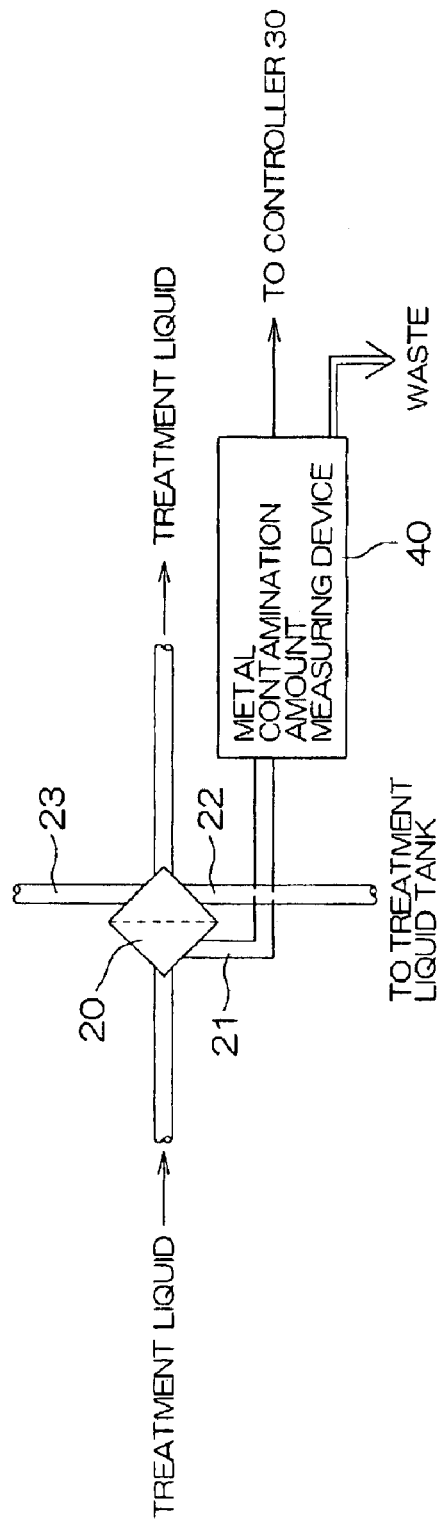
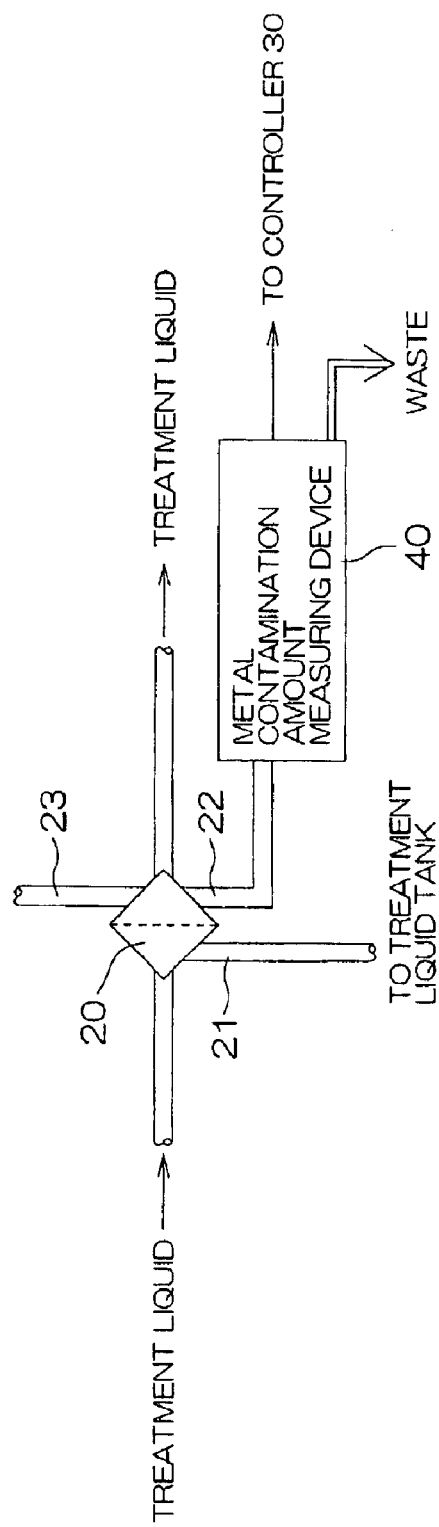
FIG. 3A
FIG. 3B

SUBSTRATE PROCESSING APPARATUS AND SUBSTRATE PROCESSING METHOD

BACKGROUND OF THE INVENTION

1. Field of the Invention

The present invention relates to substrate processing apparatus for and substrate processing method of supplying a treatment liquid onto the surface of a substrate to treat the same, and more particularly to substrate processing apparatus and method to be applied to a process in which a treatment liquid is contaminated by metal. Examples of a substrate to be treated, include a semiconductor wafer, a liquid-crystal-display-device glass substrate, a plasma-display glass substrate and the like.

2. Description of Related Art

Higher-density integration and faster operation of semiconductor integrated circuit elements are the requirements of the marketplace. To meet such requirements, copper wirings lower in resistance are increasingly used instead of conventional aluminium wirings. When a copper wiring is combined with a low-permittivity insulating film (a so-called Low-k film or insulating film made of material of which relative permittivity is smaller than that of silicon oxide) to form a multi-layer wiring, this achieves an integrated circuit element operable at a very high speed.

Copper wirings at different layers are connected to each other through a copper plug embedded in a via formed in the interlaminar insulating film. To form a fine wiring pattern, a via having a high aspect ratio is required. To form such a via, there is applied a dry etching method represented by a reactive ion etching.

According to the dry etching, however, not only the film to be treated but also a resist are corroded. A part of the resist is then changed in quality and remains, as a polymer (resist residue), on the substrate surface. Because the wiring pattern is fine, the polymer must securely be removed from the substrate before the subsequent step.

Polymer removal is carried out by supplying a polymer removing liquid onto the substrate to selectively etch the polymer.

The polymer contains copper scattered during the dry etching step. The copper is dissolved as copper ions in the polymer removing liquid. Accordingly, the polymer removing liquid after used for substrate treatment is thrown away at the present time.

However, the polymer removing liquid comprises an organic solvent mixture having a complicated composition and is therefore expensive. Accordingly, to reduce the production cost of semiconductor devices and the like, it is worth considering that the polymer removing liquid is not thrown away after single-use, but the used polymer removing liquid is collected and reutilized.

However, while the polymer removing liquid is repeatedly collected and reutilized, copper ions are accumulated in the polymer removing liquid, causing the same to be a metal contamination source. More specifically, copper ions are attached to the reverse side of a substrate or to other portions (oxide film surface and the like) of the substrate surface than the copper thin film. Such copper ions contaminate other substrate processing apparatus to which the substrate has been transferred for other treatment. This results in contamination of other substrates. As a result, there is a risk of having a profound effect on the characteristics of semiconductor devices or the like.

Similar problems may be expected not only in the polymer removing treatment, but also in a treatment in which metal contamination is accumulated in a treatment liquid, such as a bevel etching treatment for selectively removing a copper thin film at the peripheral edge of the surface of a semiconductor wafer, a reverse-side etching treatment for removing the metal contamination at the reverse side of a semiconductor wafer, or the like.

SUMMARY OF THE INVENTION

It is an object of the present invention to provide substrate processing apparatus and substrate processing method which enable a treatment liquid to be reutilized, yet preventing metal contamination from being excessively accumulated in the treatment liquid.

The present invention provides a substrate processing apparatus for supplying a treatment liquid onto the surface of a substrate to treat the same. This apparatus comprises: a circulating passage arranged such that a treatment liquid is supplied to a substrate and the treatment liquid used for substrate treatment is circulated and reutilized for other substrate treatment; a metal contamination amount measuring device for measuring the metal contamination amount in the treatment liquid passing through the circulating passage; and a judgment processing unit for judging whether or not the value measured by the metal contamination amount measuring device has exceeded a predetermined set value.

According to the arrangement above-mentioned, the treatment liquid for treating the substrate surface, is circulated through the circulating passage and is therefore repeatedly utilized. Provision is made such that the metal contamination amount in the treatment liquid circulating in the circulating passage is measured by the metal contamination amount measuring device and that it is judged whether or not the measurement value has exceeded the predetermined set value.

Accordingly, the judgment result obtained by the judgment processing unit can be utilized for generating an alarm or for controlling the supply of a new treatment liquid. This enables the treatment liquid to be repeatedly utilized within the range in which the metal contamination amount is not excessively increased. This reduces the consumption of the treatment liquid, thus not only lowering the substrate processing cost, but also preventing the metallic contamination from being excessively accumulated in the treatment liquid. This not only prevents devices formed on the substrate from being deteriorated in characteristics, but also prevents other substrate processing apparatus from being contaminated.

The metal contamination amount measuring device may sample the treatment liquid passing through the circulating passage, and may measure the metal contamination amount in the treatment liquid thus sampled. In such a case, the sampled treatment liquid is preferably not returned to the circulating passage, but is thrown away.

More specifically, the metal contamination amount measuring device may be arranged such that a chelating agent is mixed with a sampled treatment liquid to form a complex of metallic ions in the treatment liquid, that potential is applied to a mercury electrode so disposed as to come in contact with the sampled treatment liquid, causing the metallic ions formed as the complex to be adsorbed by the surface of the mercury electrode, and that the potential of the mercury electrode is then scanned. The complex is reduced and eluted from the mercury electrode surface with the inherent potential according to the type of the metallic ions. Accordingly, the metal type can be judged based on the potential value at that time, and the metallic ion concentration is measured based on the current value at that time.

A filter having an intake port through which the treatment liquid can be sampled, may be interposed in the circulating passage. In such a case, the metal contamination amount measuring device is preferably arranged to sample the treatment liquid from this filter intake port.

According to the arrangement above-mentioned, the treatment liquid can be sampled with the use of the filter intake port interposed in the course of the circulating passage. Accordingly, the metal contamination amount can be measured without the circulating passage complicated in arrangement.

The intake port may be an air vent or drain port of the filter.

The filter may be a chemical filter for catching the metallic contaminating material in the treatment liquid. According to the arrangement above-mentioned, the metallic contaminating material in the circulating passage can be caught by the chemical filter, thus enabling the treatment liquid to be lengthened in lifetime. This accordingly reduces the consumption of the treatment liquid, thus lowering the substrate processing cost.

Provision may be made such that an alarm generating device generates an alarm, in response to the judgment made by the judgment processing unit that the value measured by the metal contamination amount measuring device has exceeded the preset value. According to this arrangement, it is informed to the operator that the metal contamination amount in the treatment liquid circulating in the circulating passage has exceeded the preset value. Thus, the operator becomes aware of the new treatment liquid supply time or the treatment liquid replacement time.

Provision may be made such that a new treatment liquid is supplied into the circulating passage, in response to the judgment made by the judgment processing unit that the value measured by the metal contamination amount measuring device has exceeded the preset value. According to this arrangement, when the metal contamination amount in the treatment liquid has exceeded the preset value, a new treatment liquid is automatically supplied into the circulating passage, thus securely preventing a substrate from being treated with a treatment liquid excessively contaminated with metal.

Prior to the supply of a new treatment liquid, a part or all of the treatment liquid passing through the circulating passage is preferably discharged. According to this arrangement, apart or all of the treatment liquid can be replaced with a new treatment liquid.

The present invention provides a substrate processing method of supplying a treatment liquid to the surface of a substrate to treat the same. This method comprises: a step of circulating a treatment liquid in a circulating passage arranged such that the treatment liquid is supplied to a substrate and the treatment liquid used for substrate treatment, is circulated and reutilized for other substrate treatment; a metal contamination amount measuring step of measuring the metal contamination amount in the treatment liquid passing through the circulating passage; and a step of judging whether or not the value measured at the metal contamination amount measuring step has exceeded a predetermined set value.

The circulating passage may comprise a treatment liquid tank which stores a treatment liquid, a treatment liquid supply passage through which the treatment liquid is supplied from the treatment liquid tank to a substrate to be treated, and a treatment liquid collecting passage through which the treatment liquid after used for substrate treatment is collected to the treatment liquid tank.

In such a case, the metal contamination amount measuring device is preferably arranged to measure the metal contamination amount in the treatment liquid passing through the treatment liquid supply passage. However, there may be measured the metal contamination amount in the treatment liquid stored in the treatment liquid tank or the metal contamination amount in the treatment liquid passing through the treatment liquid collecting passage.

A substrate treatment to which the substrate processing apparatus or the substrate processing method of the present invention is applied, is a process in which metallic ions mixingly enter the treatment liquid to be used in a circulating manner. Examples of such a process include a process of treating a substrate having a metallic film formed on the substrate surface, a process of treating a substrate having metallic ions attached to the substrate surface, a process in which a treatment liquid passes through a metallic pipe (SUS pipe), and the like.

The treatment liquid may be deionized water or a chemical fluid. The chemical fluid may comprise an acid such as a hydrofluoric acid, a nitric acid, an acetic acid, a hydrochloric acid, a sulfuric acid or the like, or may comprise alkali such as ammonia or the like. The chemical fluid may be a mixture of any of the acids or alkali above-mentioned with an oxidizing agent such as a hydrogen peroxide solution, ozone or the like, or with an organic solvent such as methanol or the like. Further, the present invention may be applied to a process using a polymer removing liquid as the chemical fluid.

As the polymer removing liquid, there may be used at least one selected from a liquid comprising an organic alkali liquid, a liquid comprising an organic acid, a liquid comprising an inorganic acid, and a liquid comprising a material of the ammonium fluoride type. Examples of the liquid comprising an organic alkali liquid, include a liquid comprising at least one selected from DMF (dimethyl formamide), DMSO (dimethyl sulfoxide), hydroxylamine, and choline. Examples of the liquid comprising an organic acid include a liquid comprising at least one selected from a citric acid, an oxalic acid, an iminodi acid and a succinic acid. Examples of the liquid comprising an inorganic acid include a liquid comprising at least one selected from a hydrofluoric acid and a phosphoric acid. As the polymer removing liquid, there is a liquid comprising at least one selected from liquids each comprising any of 1-methl-2pyrrolidone, tetrahydrothiophene 1.1-dioxide, isopropanolamine, mono-ethanolamine, 2-(2aminoethoxy) ethanol, catechol, N-methylpyrrolidone, aromatic diol, tetrachloroethylene, and phenol. More specifically, examples of such a liquid include a mixture liquid of 1-methyl-2pyrrolidone with tetra-hydrothiophene 1.1-dioxide and isopropanolamine, a mixture liquid of dimethyl sulfoxide with monoethanolamine, a mixture liquid of 2-(2aminoethoxy)ethanol with hydroxyamine and catechol, a mixture liquid of 2-(2aminoethoxy)ethanol with N-methylpyrrolidone, a mixture liquid of monoethanolamine with water and aromatic diol, and a mixture liquid of tetrachloroethylene with phenol. Further, there may be stated a liquid comprising at least one selected from amines such as triethanolamine, pentamethyldiethylenetriamine or the like, propylene glycol, dipropylene glycol monomethyl ether or the like.

Examples of metal which mixingly enters the treatment liquid and of which contamination amount can be detected, include copper, aluminium, iron, zinc, chrome, nickel and the like.

These and other features, objects, advantages and effects of the present invention will be more fully apparent from the following detailed description set forth below when taken in conjunction with the accompanying drawings.

BRIEF DESCRIPTION OF THE DRAWINGS

FIG. 3A and FIG. 3B are diagrams illustrating portions of other embodiments of the present invention.

DESCRIPTION OF THE PREFERRED EMBODIMENTS

Figure 1:
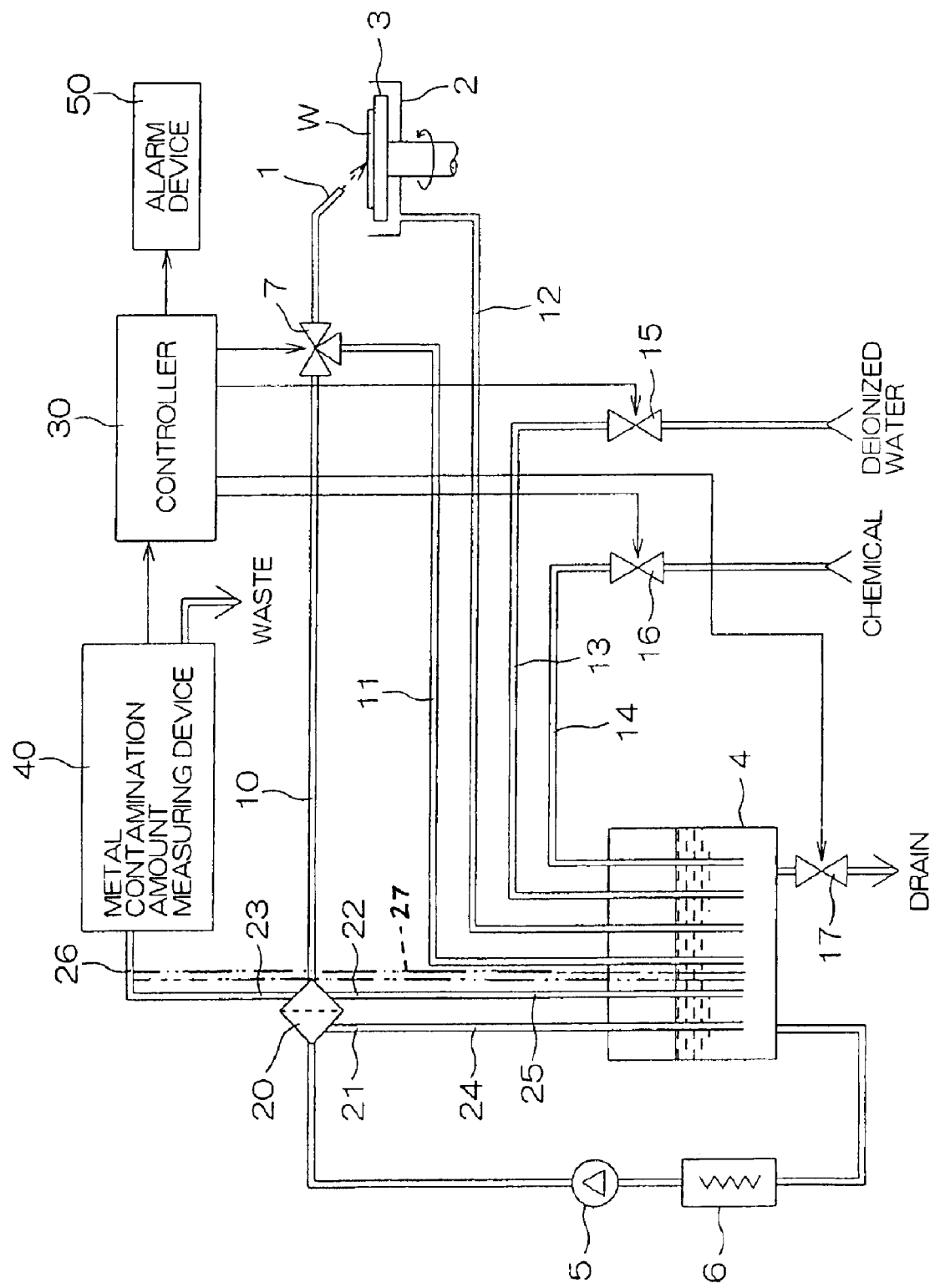
FIG. 1 is a diagram illustrating the arrangement of a substrate processing apparatus according to an embodiment of the present invention.

FIG. 1 is a diagram illustrating the arrangement of a substrate processing apparatus according to an embodiment of the present invention. This substrate processing apparatus is arranged to supply a treatment liquid from a treatment liquid supply nozzle 1 onto the surface of a substrate W such as a semiconductor wafer, a liquid-crystal-display glass substrate or the like. Further, this apparatus is of the single-substrate-processing type in which substrates W are processed one by one. More specifically, one substrate W is rotated as held by a spin chuck 3 disposed in a treatment cup 2, and a treatment liquid from the treatment liquid supply nozzle 1 is supplied onto the surface of the substrate W under rotation.

The treatment liquid is stored in a treatment liquid tank 4. Provision is made such that the treatment liquid is pumped out by a pump 5 and supplied to the treatment liquid supply nozzle 1 through a treatment liquid supply passage 10. Disposed along the treatment liquid supply passage 10 are a thermocontroller 6 for controling the temperature of the treatment liquid, a chemical filter 20 for catching a metallic contaminating material in the treatment liquid passing through the treatment liquid supply passage 10, and a three-way valve 7 serving as a switching mechanism for selectively guiding the treatment liquid to the treatment liquid supply nozzle 1 or the treatment liquid tank 4.

On the other hand, to collect, to the treatment liquid tank 4, the treatment liquid after used for treating the substrate W, a treatment liquid collecting passage 12 is disposed between the treatment cup 2 and the treatment liquid tank 4. There are further disposed a deionized water supply passage 13 and a chemical fluid supply passage 14 for respectively supplying deionized water and a chemical fluid to the treatment liquid tank 4, and these passages 13 and 14 are respectively connected to a deionized water supply source and a chemical fluid supply source through a deionized water supply valve 15 and a chemical fluid supply valve 16, respectively.

Provision is made such that the treatment liquid in the treatment liquid tank 4 is discharged, as necessary, to a drain line through a drain valve 17.

A controller 30 comprising a microcomputer and the like is disposed for controlling the three-way valve 7, the deionized water supply valve 15, the chemical fluid supply valve 16 and the drain valve 17. The controller 30 controls the three-way valve 7 such that the treatment liquid from the treatment liquid supply passage 10 is supplied to the treatment liquid supply nozzle 1 when conducting a treatment on the substrate W with the treatment liquid, and that the treatment liquid from the treatment liquid supply passage 10 is guided to the treatment liquid tank 4 through a treatment liquid return passage 11 when no treatment is conducted on the substrate W. Further, the controller 30 is arranged such that, when replacing the treatment liquid in the treatment liquid tank 4 with a new treatment liquid, the drain valve 17 is opened to discharge a part or all of the treatment liquid in the treatment liquid tank 4, and that the deionized water supply valve 15 and/or the chemical fluid supply valve 16 are then opened to supply new treatment liquids into the treatment liquid tank 4.

The chemical filter 20 has air vents 21 and 22 respectively at the primary and secondary sides, and also has a drain port 23. The primary-side air vent 21 and the secondary-side air vent 22 are connected to the treatment liquid tank 4 through air vent pipes 24, 25, respectively. On the other hand, the drain port 23 is connected to a metal contamination amount measuring device 40 through a sampling pipe 26.

The metal contamination amount measuring device 40 incorporates a pump and samples, for example at regular time intervals, a predetermined amount of the treatment liquid passing through the treatment liquid supply passage 10 via the drain port 23 of the chemical filter 20 and the sampling pipe 26. The device 40 then measures the metal contamination amount (metallic ion concentration) of the treatment liquid thus sampled, and gives the measurement result to the controller 30.

The controller 30 compares, with a predetermined set value, the metal contamination amount measured by the metal contamination amount measuring device 40, and controls, based on the comparison result, the deionized water supply valve 15, the chemical fluid supply valve 16 and the drain valve 17. As a result, the treatment liquid in the treatment liquid tank 4 is replaced with new treatment liquids at a suitable time.

When the metal contamination amount measured by the metal contamination amount measuring device 40 has exceeded the preset value above-mentioned, the controller 30 actuates an alarm device 50 to inform, to the operator of this substrate processing apparatus, the fact that the time of replacement of the treatment liquid has come. The alarm device 50 may be arranged to generate an alarm sound such as a buzzer or the like, or to generate an alarm light such as a signal display lamp, or to display an alarm message on a display screen.

For example, the metal contamination amount measuring device 40 may be arranged such that a chelating agent is mixed with a sampled treatment liquid to form a complex of metallic ions in the treatment liquid, that potential is applied to a mercury electrode disposed in the treatment liquid, causing the metallic ions formed as the complex to be adsorbed by the surface of the mercury electrode, and that the potential of the mercury electrode is then scanned. By scanning the potential, the complex is reduced and eluted from the mercury electrode surface with the inherent potential according to the metal type. The metal type can be judged based on the potential at that time, and the metallic ion concentration is measured based on the current value at that time.

Because mercury or a chelating agent mixingly enters the treatment liquid sampled for measurement of metal contamination amount, the treatment liquid thus sampled is not returned to the treatment liquid tank 4 or the like, but is wasted.

Figure 2:
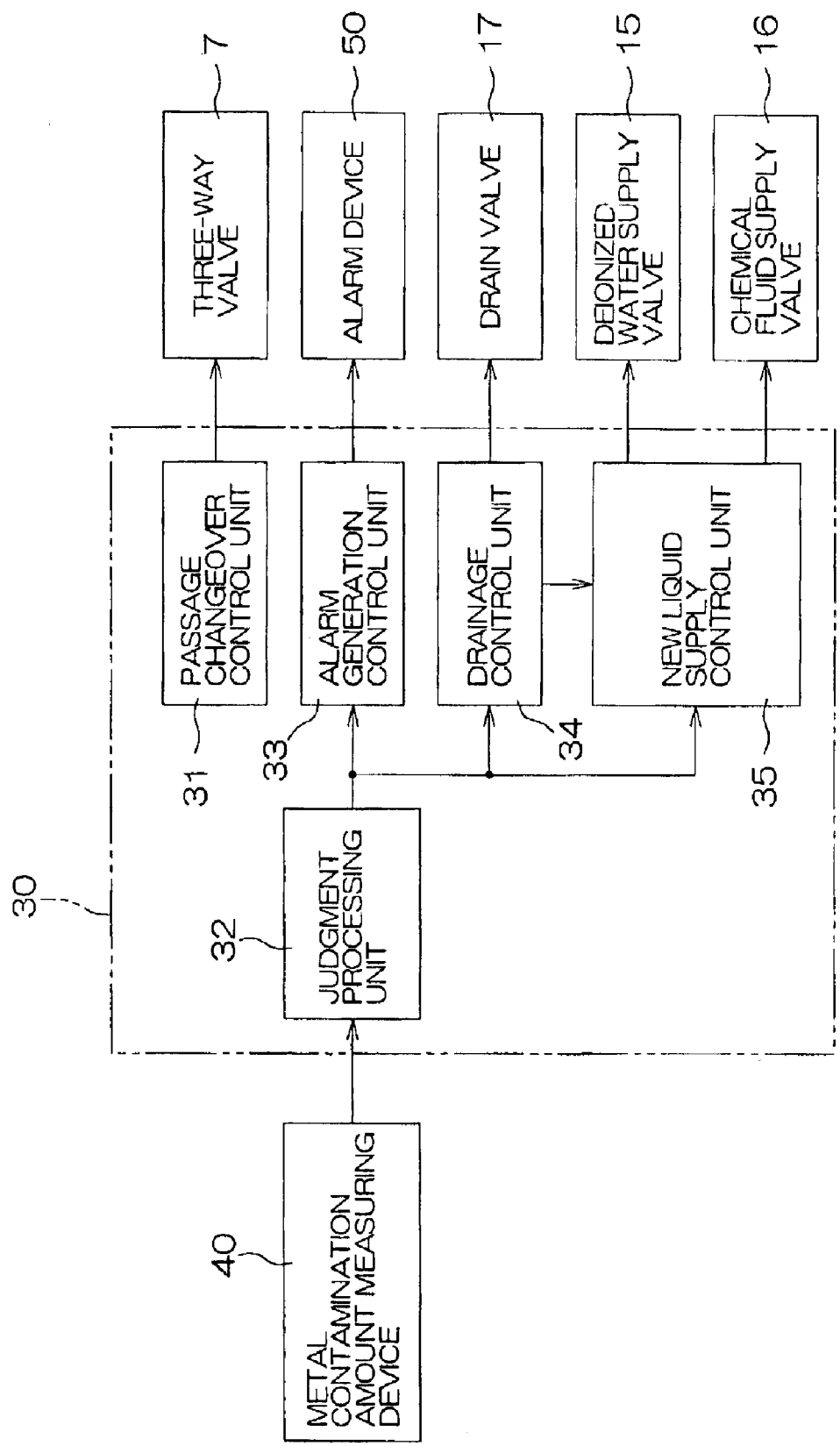
FIG. 2 is a block diagram illustrating the functional arrangement of a controller of the substrate processing apparatus in FIG. 1.

FIG. 2 is a block diagram illustrating the functional arrangement of the controller 30. The controller 30 substantially has the following functional processing units to be realized by executing a predetermined program by the microcomputer. More specifically, the controller 30 has a passage changeover control unit 31 for controlling the three-way valve 7 such that the treatment liquid from the treatment liquid supply passage 10 is supplied to the treatment liquid supply nozzle 1 when executing a treatment on a substrate W with the treatment liquid, and that the treatment liquid from the treatment liquid supply passage 10 is guided to the treatment liquid tank 4 through the treatment liquid return passage 11 when no treatment is executed on a substrate W. Further, the controller 30 has: a judgment processing unit 32 for judging whether or not the metal contamination amount measured by the metal contamination amount measuring device 40 has exceeded the preset value above-mentioned; an alarm generation control unit 33 for actuating the alarm device 50, in response to the judgment made by the judgment processing unit 32 that the metal contamination amount has exceeded the preset value; a drainage control unit 34 for opening the drain valve 17 for discharging a part or all of the circulating treatment liquid, in response to the judgment made by the judgment processing unit 32 that the metal contamination amount has exceeded the preset value; and a new liquid supply control unit 35 arranged such that when the judgment processing unit 32 judged that the metal contamination amount had exceeded the preset value, the deionized water supply valve 15 and the chemical fluid supply valve 16 are opened to supply new treatment liquids to the treatment liquid tank 4 after a part or all of the treatment liquid has been discharged by controlling the opening/closing of the drain valve 17 by the drainage control unit 34.

Provision may be made such that the treatment liquid in the treatment liquid tank 4 is not discharged prior to the supply of new liquids. In such a case, provision may be made such that, in response to the judgment made by the judgment processing unit 32 that the metal contamination amount has exceeded the preset value, the new liquid supply control unit 35 opens the deionized water supply valve 15 and the chemical fluid supply valve 16 without waiting for drainage.

Further, there maybe present a period of time during which there are simultaneously carried out both the drainage of the treatment liquid in the treatment liquid tank 4 and the supply of new liquids from the deionized water supply valve 15 and the chemical fluid supply valve 16.

In the substrate processing apparatus having the arrangement above-mentioned, the treatment liquid in the treatment liquid tank 4 is supplied to a substrate W from the treatment liquid supply nozzle 1 through the treatment liquid supply passage 10, and the treatment liquid after used for treatment of the substrate W is collected to the treatment liquid tank 4 through the treatment liquid collecting passage 12. More specifically, the treatment liquid tank 4, the treatment liquid supply passage 10 and the treatment liquid collecting passage 12 form a circulating passage for circulating the treatment liquid for reutilization. This enables the treatment liquid to be repeatedly used, thus reducing the consumption of the treatment liquid, resulting in reduction of the cost required for substrate treatment.

On the other hand, the substrate processing apparatus according to this embodiment is arranged such that the metal contamination amount in the treatment liquid passing through the treatment liquid supply passage 10, is measured by the metal contamination amount measuring device 40, and that when the measurement result has exceeded a predetermined set value, the treatment liquid in the treatment liquid tank 4 is then replaced with a new treatment liquid. This does not involve the likelihood that the treatment liquid to be supplied onto the surface of a substrate W contains a large amount of metallic contaminating material, thus preventing the substrate W from being undesirably contaminated by metal. Thus, no bad influence is exerted to the characteristics of devices formed on the substrate W, and neither other substrate processing apparatus nor other substrates are contaminated by metal.

Further, when the metal contamination amount has exceeded the preset value, the alarm device 50 generates an alarm. Thus, the operator can become aware of the fact that the metal contamination amount in the treatment liquid has reached the preset value and the fact that the treatment liquid is accordingly replaced.

The substrate processing apparatus according to this embodiment can be used, for example, as a polymer removing apparatus. More specifically, the present invention may be embodied in the form of a substrate processing apparatus using, as the treatment liquid, a polymer removing liquid for removing the resist residue (polymer) remaining on the surface of a substrate W at the time when a copper thin film formed on the surface of the substrate W is patterned by dry etching. In such a case, the treatment liquid tank 4 stores a polymer removing liquid and the spin chuck 3 holds a substrate W after a patterning treatment of a copper thin film has been executed by dry etching (substrate having a copper thin film on the surface).

The polymer mixingly contains a corroded resist and copper as the film material to be treated. When the polymer is removed from the surface of the substrate W by the polymer removing liquid, the treatment liquid or polymer removing liquid after supplied to the substrate W, mixingly contains copper ions. While the polymer removing liquid is circulated and reutilized, copper ions are increasingly accumulated in the polymer removing liquid.

In such a process, the metal contamination amount measuring device 40 samples, at regular time intervals, a predetermined amount of the polymer removing liquid from the treatment liquid supply passage 10, measures the metal contamination amount (copper ion concentration), and gives the measurement result to the controller 30. Accordingly, when the copper ion concentration of the polymer removing liquid has reached a predetermined set value, the controller 30 opens the drain valve 17 to discharge a part or all of the polymer removing liquid in the treatment liquid tank 4 and opens the deionized water supply valve 15 and/or the chemical fluid supply valve 16 to supply a new polymer removing liquid having a predetermined concentration to the treatment liquid tank 4. Thus, the circulation and reutilization of the polymer removing liquid restrains the consumption thereof, while the polymer removing liquid can be restrained from being excessively increased in copper ion concentration.

Further, when there is used, as the treatment liquid, a chemical fluid comprising an acid such as a hydrofluoric acid, a nitric acid, an acetic acid, a hydrochloric acid, a sulfuric acid or the like, the substrate processing apparatus above-mentioned may be used as an etching apparatus (for example, bevel etching apparatus or reverse-side etching apparatus) for etching a thin film formed on the surface of a substrate W, or as a substrate cleaning apparatus for cleaning the surface of a substrate W under the etching action of the chemical fluid. It is a matter of course that the substrate processing apparatus above-mentioned maybe applied to etching apparatus or substrate cleaning apparatus using a chemical fluid comprising alkali such as ammonia or the like. The chemical fluid to be used for the etching processing or substrate cleaning processing may be a mixture liquid of any of the acids or alkali above-mentioned with an oxidizing agent such as a hydrogen peroxide solution, ozone or the like, or with an organic solvent such as methanol or the like.

Examples of the metal which can be measured by the metal contamination amount measuring device 40 include copper, aluminium, iron, zinc, chrome, nickel and the like. Accordingly, the substrate processing apparatus can widely be applied to a process having the possibility of any of the metals above-mentioned mixingly entering the treatment liquid.

The foregoing has discussed an embodiment of the present invention, but the present invention may also be embodied in other manner. For example, the embodiment above-mentioned is arranged to automatically replace the treatment liquid circulating in the circulating passage by controlling the deionized water supply valve 15, the chemical fluid supply valve 16 and the drain valve 17. However, provision may be made such that when the controller 30 actuates the alarm device 50, the operator manually replaces the treatment liquid. Further, in the substrate processing apparatus above-mentioned arranged to automatically replace the treatment liquid, the alarm device 50 may be omitted.

When a part of the treatment liquid in the treatment liquid tank 4 is discharged and new treatment liquids are supplied, the treatment of the substrate W can continuously be executed. However, when all treatment liquid in the treatment liquid tank 4 is discharged at the time of replacement of the treatment liquid, it is required to once stop the substrate W treatment. To replace all the treatment liquid yet assuring the continuous substrate W treatment, for example two treatment liquid tanks 4 may be disposed and used alternately.

In the embodiment above-mentioned, the metal contamination amount measuring device 40 is arranged to sample the treatment liquid from the drain port 23 of the chemical filter 20. However, the treatment liquid may be sampled from the primary-side air vent 21 as shown in FIG. 3A, or from the secondary-side air vent 22 as shown in FIG. 3B. Further, when other filter is disposed at the treatment liquid supply passage 10 or the like, the treatment liquid may be sampled from such a filter. Further, the treatment liquid may be sampled from the treatment liquid supply passage 10 at a position different from the filter.

Further, the treatment liquid may be sampled from the treatment liquid collecting passage 12, or the treatment liquid stored in the treatment liquid tank 4 may be sampled via an optional sampling pipe 27, for measurement of the metal contamination amount.

Embodiments of the present invention have been discussed in detail, but these embodiments are mere specific examples for clarifying the technical contents of the present invention. Therefore, the present invention should not be construed as limited to these specific examples. The spirit and scope of the present invention are limited only by the appended claims.

This Application corresponds to Japanese Patent Application Serial No. 2002-9131 filed on Jan. 17, 2002 with Japanese Patent Office, the disclosure of which is incorporated herein by reference.

I claim:

1. A substrate processing apparatus for supplying a treatment liquid onto a surface of a substrate to treat the same, comprising:

a spin chuck for holding and rotating the substrate;

a nozzle for supplying a treatment liquid to the substrate held by the spin chuck;

a circulating passage arranged such that the treatment liquid supplied to the substrate from the nozzle and used for substrate treatment is circulated to the nozzle and reutilized for substrate treatment, the circulating passage including a treatment liquid tank which stores the treatment liquid, a treatment liquid supply passage through which the treatment liquid is supplied from the treatment liquid tank to the substrate, and a treatment liquid collecting passage through which the treatment liquid after the substrate treatment is returned to the treatment liquid tank;

a metal contamination amount measuring device for measuring a metal contamination amount in the treatment liquid which circulates in the circulating passage and is arranged for sampling said treatment liquid at a part of the circulating passage from the treatment liquid tank through the nozzle; and a judgment processing unit for judging whether or not a value measured by the metal contamination amount measuring device has exceeded a predetermined set value.

2. A substrate processing apparatus according to claim 1, wherein the metal contamination amount measuring device samples the treatment liquid passing through the part of the circulating passage and measures the metal contamination amount in the treatment liquid thus sampled.

3. A substrate processing apparatus according to claim 2, wherein there is further disposed, in the part of the circulating passage, a filter having an inlet port through which the treatment liquid from the liquid tank is introduced, an outlet port through which the treatment liquid comes out toward the nozzle, and an intake port through which the treatment liquid is to be sampled, and the metal contamination amount measuring device is arranged to sample the treatment liquid from the intake port of the filter.

4. A substrate processing apparatus according to claim 3, wherein the intake port is an air vent or drain port of the filter.

5. A substrate processing apparatus according to claim 3, wherein the filter is a chemical filter for catching the metallic contaminating material in the treatment liquid.

6. A substrate processing apparatus according to claim 1, further comprising:

an alarm device for generating a predetermined alarm; and an alarm generation control unit for actuating the alarm device to generate an alarm, in response to the judgment made by the judgment processing unit that the value measured by the metal contamination amount measuring device has exceeded the preset value.

7. A substrate processing apparatus according to claim 1, further comprising:

a new liquid supply passage through which a new treatment liquid is supplied to the circulating passage;

a new liquid supply valve disposed in the new liquid supply passage; and a new liquid supply control unit for opening the new liquid supply valve to supply a new treatment liquid to the circulating passage, in response to the judgment made by the judgment processing unit that the value measured by the metal contamination amount measuring device has exceeded the preset value.

8. A substrate processing apparatus according to claim 7, further comprising:
- a drain valve for discharging a part or all of the treatment liquid which circulates in the circulating passage; and
- a drainage control unit for opening the drain valve to discharge a part or all of the treatment liquid circulating in the circulating passage, prior to the supply of a new treatment liquid into the circulating passage from the new liquid supply valve controlled by the new liquid supply control unit.

9. A substrate processing apparatus according to claim 1, wherein the treatment liquid is capable of removing a polymer, and the substrate processing apparatus is a polymer removing apparatus for removing a polymer remaining on the surface of a substrate.

10. A substrate processing apparatus according to claim 1, wherein the treatment liquid is a chemical fluid containing an acid or alkali, and the substrate processing apparatus is an etching apparatus for etching a thin film formed on the substrate surface.

11. A substrate processing apparatus according to claim 1, wherein the treatment liquid is a chemical fluid containing an acid or alkali, and the substrate processing apparatus is a substrate cleaning apparatus for cleaning the substrate surface under the etching action of the chemical fluid.

12. A substrate processing apparatus according to claim 1, wherein the metal contamination amount measuring device measures the metal contamination amount in the treatment liquid existing in the treatment liquid supply passage.

13. A substrate processing apparatus according to claim 1, wherein the metal contamination amount measuring device measures a the metal contamination amount in the treatment liquid within the treatment liquid tank.

14. A substrate processing method of supplying a treatment liquid to a surface of a substrate to treat the same, the method comprising:
- a substrate holding and rotating step of holding the substrate by a spin chuck and rotating the substrate;
- a treatment liquid supply step of supplying a treatment liquid from a nozzle to the substrate held by the spin chuck during the substrate holding and rotating step;
- a step of circulating the treatment liquid in a circulating passage arranged such that the treatment liquid supplied to the substrate from the nozzle and used for substrate treatment, is circulated to the nozzle and reutilized for substrate treatment, the circulating passage including a treatment liquid tank which stores the treatment liquid, a treatment liquid supply passage through which the treatment liquid is supplied from the treatment liquid tank to the substrate, and a treatment liquid collecting passage through which the treatment liquid after the substrate treatment is returned to the treatment liquid tank;
- a metal contamination amount measuring step of measuring the metal contamination amount in the treatment liquid which circulates through the circulating passage at a part of the circulating passage from the treatment liquid tank through the nozzle; and
- a step of judging whether or not a value measured at the metal contamination amount measuring step has exceeded a preset value.

15. A substrate processing method according to claim 14, further comprising an alarm generating step of generating an alarm from an alarm device, in response to the judgment made at the judgment step that the value measured at the metal contamination amount measuring step has exceeded the preset value.

16. A substrate processing method according to claim 14, further comprising a new liquid supply step of supplying a new treatment liquid in the circulating passage through a new liquid supply passage, in response to the judgment made at the judgment step that the value measured at the metal contamination amount measuring step has exceeded the preset value.

17. A substrate processing method according to claim 16, further comprising a drain step of discharging a part or all of the treatment liquid passing through the circulating passage, prior to the new liquid supply step.

18. A substrate processing method according to claim 14, wherein the treatment liquid is a polymer removing liquid capable of removing the treatment liquid which remains on the substrate surface.

19. A substrate processing method according to claim 14, wherein the treatment liquid is a chemical fluid containing an acid or alkali to be used for etching a thin film formed on the substrate surface.

20. A substrate processing method according to claim 14, wherein the treatment liquid is a chemical fluid containing an acid or alkali to be used for cleaning the substrate surface under an etching action.

* * * * *